United States Patent
Balakrishnan et al.

(10) Patent No.: US 9,406,748 B1
(45) Date of Patent: Aug. 2, 2016

(54) PERFECTLY SHAPED CONTROLLED NANOWIRES

(71) Applicant: International Business Machines Corporation, Armonk, NY (US)

(72) Inventors: Karthik Balakrishnan, White Plains, NY (US); Kangguo Cheng, Schenectady, NY (US); Bruce B. Doris, Slingerlands, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/947,444

(22) Filed: Nov. 20, 2015

(51) Int. Cl.
| | |
|---|---|
| H01L 21/336 | (2006.01) |
| H01L 29/06 | (2006.01) |
| H01L 29/40 | (2006.01) |
| H01L 29/66 | (2006.01) |
| H01L 21/84 | (2006.01) |
| H01L 27/12 | (2006.01) |
| H01L 29/423 | (2006.01) |
| H01L 21/02 | (2006.01) |
| H01L 21/3213 | (2006.01) |
| H01L 21/311 | (2006.01) |

(52) U.S. Cl.
CPC ...... *H01L 29/0673* (2013.01); *H01L 21/02636* (2013.01); *H01L 21/31111* (2013.01); *H01L 21/32139* (2013.01); *H01L 21/845* (2013.01); *H01L 27/1211* (2013.01); *H01L 29/401* (2013.01); *H01L 29/42392* (2013.01); *H01L 29/6681* (2013.01); *H01L 29/66545* (2013.01)

(58) Field of Classification Search
CPC .......... H01L 29/41791; H01L 27/10826; H01L 27/0924; H01L 21/823431; H01L 2221/1094; H01L 29/0669; H01L 21/02603; H01L 29/42392; H01L 21/845; H01L 29/66545
USPC .......... 257/288, 368, 269; 438/151, 197, 199; 977/762, 938
See application file for complete search history.

(56) References Cited

U.S. PATENT DOCUMENTS

| | | |
|---|---|---|
| 8,441,043 B2 | 5/2013 | Bangsaruntip et al. |
| 8,461,035 B1 | 6/2013 | Cronquist et al. |
| 8,580,624 B2 | 11/2013 | Bangsaruntip et al. |
| 8,653,599 B1 | 2/2014 | Cheng et al. |
| 8,722,472 B2 | 5/2014 | Chang et al. |
| 8,853,019 B1 | 10/2014 | Fronheiser et al. |
| 2012/0168872 A1 | 7/2012 | Chang et al. |

(Continued)

*Primary Examiner* — Jarrett Stark
*Assistant Examiner* — Shahed Ahmed
(74) *Attorney, Agent, or Firm* — Scully, Scott, Murphy & Presser, P.C.; Louis J. Percello, Esq.

(57) ABSTRACT

A fin stack structure is provided on an insulator layer. The fin stack structure comprises, from bottom to top, a first semiconductor fin portion, a dielectric fin portion, a second semiconductor fin portion and a hard mask fin portion. A sacrificial gate structure is formed on a portion of the fin stack structure. The hard mask fin portion and the dielectric fin portion not located beneath the sacrificial gate structure are removed. An epitaxial semiconductor material structure is then formed from exposed surfaces of each semiconductor fin portion. The sacrificial gate structure is then removed. Next, remaining portions of the hard mask fin portion and the dielectric fin portion are removed. The insulating layer is then recessed. After recessing the insulator layer, the first and second semiconductor fin portions are suspended and are stacked one atop the other.

15 Claims, 9 Drawing Sheets

(56) References Cited

U.S. PATENT DOCUMENTS

| | | | |
|---|---|---|---|
| 2014/0042386 A1* | 2/2014 | Cea | H01L 29/42392 257/9 |
| 2014/0151639 A1* | 6/2014 | Chang | H01L 29/42392 257/27 |
| 2015/0056781 A1* | 2/2015 | Akarvardar | H01L 21/76264 438/413 |
| 2015/0108573 A1* | 4/2015 | Liu | H01L 21/823487 257/347 |
| 2015/0372119 A1* | 12/2015 | Zhang | B82Y 10/00 438/268 |
| 2016/0049489 A1* | 2/2016 | Wan | H01L 29/42392 257/347 |

* cited by examiner

PERFECTLY SHAPED CONTROLLED NANOWIRES

BACKGROUND

The present application relates to a semiconductor structure and a method of forming the same. More particularly, the present application relates to a gate-all-around semiconductor structure including a stack of suspended semiconductor nanowires that have a uniform shape and dimension and a method of forming the same.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, gate-all-around semiconductor nanowire field effect transistors is the next step in the evolution of complementary metal oxide semiconductor (CMOS) devices.

In its basic form, gate-all-around semiconductor nanowire field effect transistors include at least one semiconductor nanowire including a source region, a drain region and a channel region located between the source region and the drain region, and a gate electrode that wraps around the channel region of the at least one semiconductor nanowire. A gate dielectric is typically disposed between the channel region of the at least one semiconductor nanowire and the gate electrode. The gate electrode regulates electron flow through the semiconductor nanowire channel between the source region and the drain region.

Gate-all-around semiconductor nanowire field effect transistors can achieve higher drive currents with increasingly smaller dimensions as compared to conventional planar FETs. Stacked semiconductor nanowires, in which the semiconductor nanowires are formed one atop another, afford higher density than their non-stacked semiconductor nanowire counterparts.

In the fabrication of semiconductor nanowires, it is very challenging to produce semiconductor nanowires that have a desired shape and dimension. This challenge is further compounded when stacked semiconductor nanowires are fabricated. Another issue in fabricating gate-all-around semiconductor nanowire field effect transistors having stacked semiconductor nanowires is the suspension of each stacked semiconductor nanowire.

In view of the above, there is a need for providing gate-all-around semiconductor nanowire field effect transistors in which a stack of suspended semiconductor nanowires is provided in which each semiconductor nanowire has a same shape and a same dimension (i.e., height and width).

SUMMARY

A fin stack structure is provided on an insulator layer. The fin stack structure comprises, from bottom to top, a first semiconductor fin portion, a dielectric fin portion, a second semiconductor fin portion and a hard mask fin portion. A sacrificial gate structure is formed on a portion of the fin stack structure. The hard mask fin portion and the dielectric fin portion not located beneath the sacrificial gate structure are removed. An epitaxial semiconductor material structure is then formed from exposed surfaces of each semiconductor fin portion. The sacrificial gate structure is then removed. Next, remaining portions of the hard mask fin portion and the dielectric fin portion are removed. The insulating layer is then recessed. After recessing the insulator layer, the first and second semiconductor fin portions are suspended and are stacked one atop the other.

In one aspect of the present application, a method of forming a semiconductor structure is provided. In one embodiment of the present application, the method includes providing at least one fin stack structure on an insulator layer. The at least one fin stack structure comprises from bottom to top, a first semiconductor fin portion, a dielectric fin portion, a second semiconductor fin portion and a hard mask fin portion. Next, at least one sacrificial gate structure is formed on a portion of the at least one fin stack structure. After forming the at least one sacrificial gate structure, the hard mask fin portion and the dielectric fin portion that are not located beneath the at least one sacrificial gate structure are removed. Next, an epitaxial semiconductor material structure is formed from exposed surfaces of the first semiconductor fin portion and the second semiconductor fin portion not covered by the at least one sacrificial gate structure. The at least one sacrificial gate structure is then removed. Next, remaining portions of the hard mask fin portion and remaining portions of the dielectric fin portion of the at least one fin stack structure that were previously located beneath the at least one sacrificial gate structure are removed. The insulating layer is then recessed. After recessing the insulator layer, the first semiconductor fin portion and the second semiconductor fin portion are suspended and are stacked one atop the other.

In another aspect of the present application, a semiconductor structure is provided. In one embodiment of the present application, the semiconductor structure includes a stack of suspended semiconductor nanowires located above a surface of an insulator layer portion, wherein each semiconductor nanowire of the stack has a same shape and dimension. A functional gate structure wraps around each suspended semiconductor nanowire of the stack.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
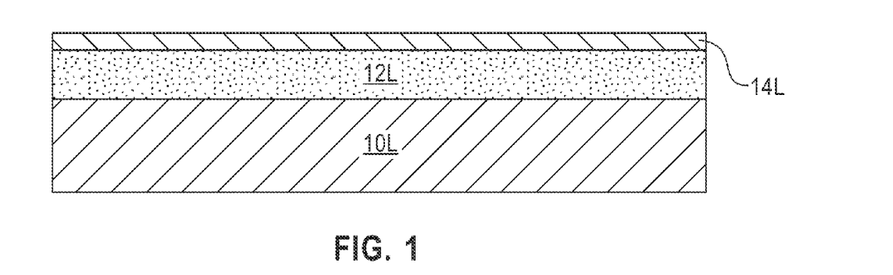
FIG. 1 is a cross sectional view of an exemplary semiconductor structure of a first substrate including, from bottom to top, a first handle substrate, a first insulator layer and a first semiconductor material layer that can be employed in accordance with an embodiment of the present application.

Referring first to FIG. 1, there is illustrated an exemplary semiconductor structure of a first substrate (10L, 12L, 14L) including, from bottom to top, a first handle substrate 10L, a first insulator layer 12L and a first semiconductor material layer 14L that can be employed in accordance with an embodiment of the present application. Collectively, the first handle substrate 10L, the first insulator layer 12L and the first semiconductor material layer 14L and thus the first substrate may be referred to herein as a first semiconductor-on-insulator (SOI) substrate.

In one embodiment of the present application, the first handle substrate 10L may include at least one semiconductor material that has semiconductor properties. Examples of materials that have semiconducting properties and thus can be employed as the semiconductor material that provides the first handle substrate 10L include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, the first handle substrate 10L is composed entirely of silicon.

In another embodiment of the present application, the first handle substrate 10L may be composed of a non-semiconductor material including, for example, a dielectric material and/or a conductive material.

When the first handle substrate 10L is composed of at least one semiconductor material, the at least one semiconductor material that provides the first handle substrate 10L may be single crystalline, polycrystalline or amorphous. In one example, the first handle substrate 10L is composed of single crystalline silicon.

When the first handle substrate 10L is composed of at least one semiconductor material, the at least one semiconductor material that provides the first handle substrate 10L may have any of the well known crystal orientations. For example, the crystal orientation of the first handle substrate 10L may be {100}, {110}, or {111}. Other crystallographic orientations besides those specifically mentioned can also be used in the present application.

The first insulator layer 12L of the exemplary semiconductor structure shown in FIG. 1 may be a crystalline or non-crystalline dielectric material such as an oxide and/or nitride. In one embodiment, the first insulator layer 12L is a dielectric oxide such as, for example, silicon dioxide. In another embodiment of the present application, the first insulator layer 12L may be a dielectric nitride such as, for example, silicon nitride or boron nitride. In yet another embodiment of the present application, the first insulator layer 12L may include a stack of a dielectric oxide and a dielectric nitride. In one example, a stack of, in any order, silicon dioxide and silicon nitride or boron nitride may be employed as the first insulator layer 12L. The first insulator layer 12L may have a thickness from 10 nm to 200 nm, although other thicknesses that are lesser than, or greater than, the aforementioned thickness range may also be employed as the thickness of the first insulator layer 12L.

The first semiconductor material layer 14L includes one of the semiconductor materials mentioned above for the first handle substrate 10L. The semiconductor material that provides the first semiconductor material layer 14L may be a relaxed semiconductor material or a strained semiconductor material. In one embodiment, the semiconductor material that provides the first semiconductor material layer 14L includes a same semiconductor material as the first handle substrate 10L. In one example, silicon is employed as the semiconductor material for both the first handle substrate 10L and the first semiconductor material layer 14L. In another embodiment, the first semiconductor material layer 14L includes a semiconductor material that differs from a semiconductor material that provides the first handle substrate 10L. In one example, the first handle substrate 10L may be composed of silicon, while the first semiconductor material layer 14L may be composed of a silicon germanium alloy.

The first semiconductor material layer 14L may have one of the crystal orientations mentioned above for the semiconductor material that provides the first handle substrate 10L. In one embodiment, the crystal orientation of the first semiconductor material 14L is the same as the crystal orientation of the first handle substrate 10L. In another embodiment, the crystal orientation of the first semiconductor material layer 14L differs from the crystal orientation of the first handle substrate 10L. Typically, the first semiconductor material layer 14L is a single crystalline semiconductor material. The first semiconductor material layer 14L may have a thickness from 10 nm to 100 nm, although other thicknesses that are lesser than, or greater than, the aforementioned thickness range may also be employed as the thickness of the first semiconductor material layer 14L.

In one embodiment, the first substrate (10L, 12L, 14L) may be formed by wafer bonding. In yet another embodiment, the first substrate (10L, 12L, 14L) may be formed by an implantation process known as SIMOX (i.e., Separation by IMplanting OXygen). In some embodiments of the present application, a thermal mixing process or a thermal condensation process may be employed in forming the first semiconductor material layer 14L. Thermal mixing includes annealing in an inert ambient (i.e., helium and/or argon), while thermal condensation includes annealing in an oxidizing ambient (air, oxygen, ozone and/or $NO_2$). The anneal temperature for both thermal mixing and thermal condensation can be from 600° C. to 1200° C. In such a process a sacrificial silicon germanium alloy layer having a first germanium content can formed on a silicon layer that is located atop the first insulator layer. One of thermal mixing or thermal condensation can then be performed to convert the Si/SiGe material stack into a silicon germanium alloy layer having a second germanium content that differs from the first germanium content. The silicon germanium alloy having the second germanium content can be used as the first semiconductor material layer 14L of the first substrate exemplified in FIG. 1.

Figure 2:
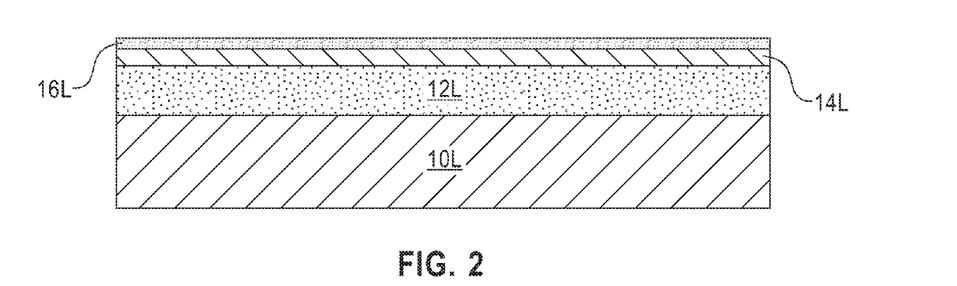
FIG. 2 is a cross sectional view of the exemplary semiconductor structure of FIG. 1 after forming a first dielectric layer on an exposed surface of the first semiconductor material layer.

Referring now to FIG. 2, there is illustrated the exemplary semiconductor structure of FIG. 1 after forming a first dielectric layer 16L on an exposed surface of the first semiconductor material layer 14L. The first dielectric layer 16L is employed in the present application as a dielectric material bonding layer in a subsequent dielectric-to-dielectric bonding process. The first dielectric layer 16L may include one of the materials mentioned above for the first insulator layer 12L. In one embodiment, the first dielectric material layer 16L is composed of a same material as the first insulator layer 12L. In one example, both the first dielectric layer 16L and the first insulator layer 12L are composed of silicon dioxide. The first dielectric layer 16L can have a thickness from 1 nm to 10 nm, although other thicknesses that are lesser than, or greater than, the aforementioned thickness range may also be employed as the thickness of the first dielectric layer 16L.

In one embodiment of the present application, the first dielectric layer 16L can be formed utilizing a deposition process such as, for example, chemical vapor deposition (CVD) or plasma enhanced chemical vapor deposition (PECVD). In another embodiment of the present application, the first dielectric layer 16L can be formed utilizing a thermal oxidation or thermal nitridation process.

Figure 3:
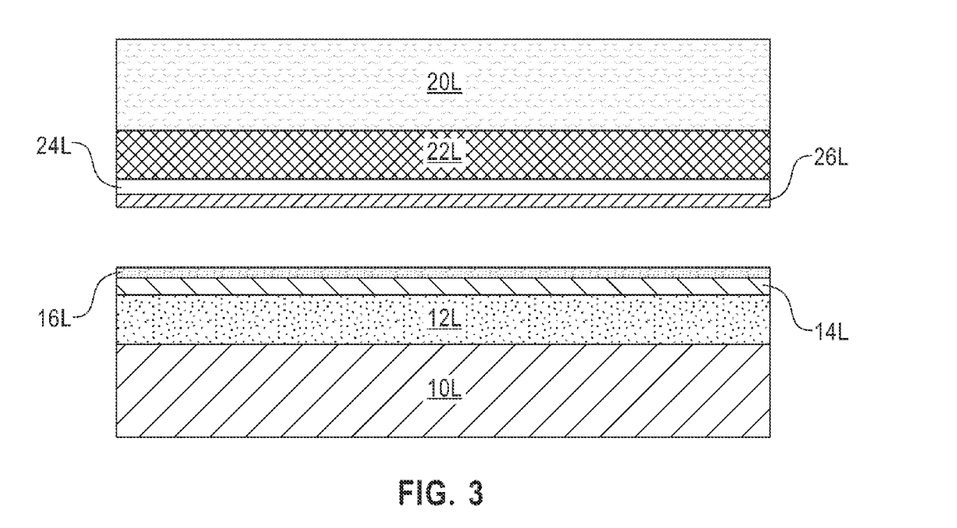
FIG. 3 is a cross sectional view showing a second substrate atop the exemplary semiconductor structure shown in FIG. 2 and including a second handle substrate, a second insulator layer, and a second semiconductor material layer, wherein a second dielectric layer is located on the second semiconductor material layer.

Referring now to FIG. 3, there is illustrated a second substrate (20L, 22L, 24L) atop the exemplary semiconductor structure shown in FIG. 2. The second substrate (20L, 22L, 24L) includes a second handle substrate 20L, a second insulator layer 22L, and a second semiconductor material layer 24L. As is further shown, a second dielectric layer 26L is located on the second semiconductor material layer 24L.

The second handle substrate 20L may include any of the materials mentioned above for the first handle substrate 10L. In one embodiment, the first handle substrate 10L and the second handle substrate 20L include a same material. In one example, the first handle substrate 10L and the second handle substrate 20L include silicon.

The second insulator layer 22L may include any of the materials mentioned above for the first insulator layer 12L. In one embodiment, the first insulator layer 12L and the second insulator layer 22L may include a same insulator material such as, for example, silicon dioxide.

The second semiconductor material layer 24L may include one of the semiconductor materials mentioned above for the first semiconductor material layer 14L. In one embodiment, the second semiconductor material layer 24L and the first semiconductor material layer 14L comprise a same semiconductor material, such as, for example, silicon or a silicon germanium alloy. In another embodiment, the second semiconductor material layer 24L comprises a different semiconductor material than the first semiconductor material layer 14L. In one example, the first semiconductor material layer 14L may be composed of silicon, while the second semiconductor material layer 24L may be composed of a silicon germanium alloy or a III-V compound semiconductor. The second semiconductor material layer 24L that is provided has a same thickness as that of the first second material layer 14L mentioned above.

The second substrate (20L, 22L, 24L) may be referred to as a second SOI substrate. The second substrate (20L, 22L, 24L) can be formed utilizing one of the techniques mentioned above in forming the first substrate (10L, 12L, 14L).

The second dielectric layer 26L may include one of the materials mentioned above for the first dielectric layer 16L. In one embodiment of the present application, the first and second dielectric layers 16L, 26L are both composed of a same material such as, for example, silicon dioxide. In another embodiment of the present application, the second dielectric layer 26L is composed of a different material than the first dielectric layer 16L. The second dielectric layer 26L may have a thickness within the range mentioned above for the first dielectric layer 16L. The thickness of the second dielectric layer 26L may be the same as, lesser than, or greater than, the thickness of the first dielectric layer 16L. The second dielectric layer 26L may be formed utilizing one of the techniques mentioned above in forming the first dielectric layer 16L.

Figure 4:
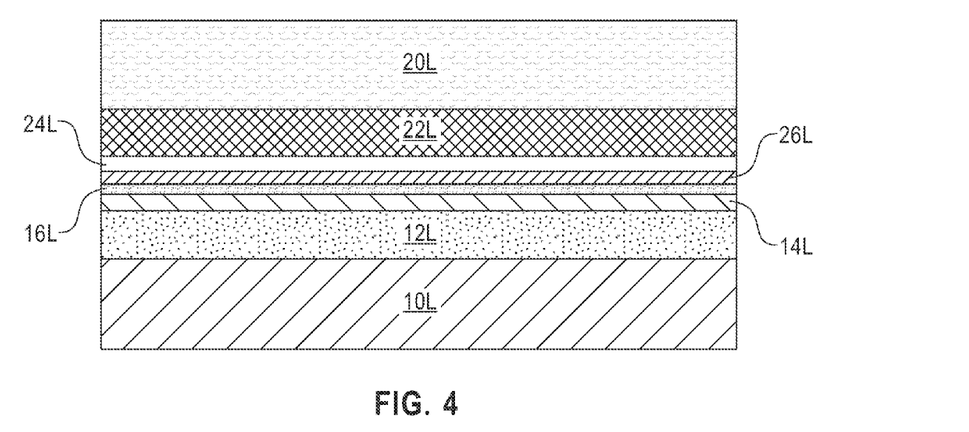
FIG. 4 is a cross sectional view of the exemplary semiconductor structure of FIG. 3 after bonding the first dielectric layer to the second dielectric layer.

Referring now to FIG. 4, there is illustrated the exemplary semiconductor structure of FIG. 3 after bonding the first dielectric layer 16L to the second dielectric layer 26L. Bonding includes contacting an exposed surface of the first dielectric layer 16L that is attached to the first substrate (10L, 12L, 14L) to the second dielectric layer 26L that is attached to the second substrate (20L, 22L, 24L). A dielectric-to-dielectric bonding interface is formed. Bonding can be performed utilizing any bonding temperature including, for example, from room temperature (20° C.) up to 1200° C. Bonding can be performed in an inert ambient and an external force may or may not be applied during a part of, or the entirety of, the bonding process.

Figure 5:
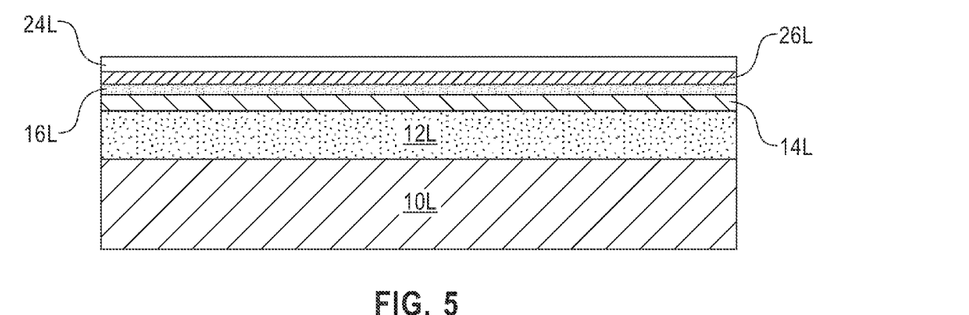
FIG. 5 is a cross sectional view of the exemplary semiconductor structure of FIG. 4 after removing the second handle substrate and the second insulator layer.

Referring now to FIG. 5, there is illustrated the exemplary semiconductor structure of FIG. 4 after removing the second handle substrate 20L and the second insulator layer 22L. The removal of the second handle substrate 20L and the second insulator layer 22L exposes a surface of the second semiconductor material layer 24L which is now attached to the first substrate (10L, 12L, 14L) through the bonded first and second dielectric layers 16L, 26L.

In one embodiment, the removal of the second handle substrate 20L and the second insulator layer 22L may be performed utilizing a single removal process such as, for example, a planarization process or an etching process. In one example, the removal of the second handle substrate 20L and the second insulator layer 22L are performed by utilizing a planarization such as, for example, chemical mechanical planarization or grinding. In another embodiment, the removal of the second handle substrate 20L and the second insulator layer 22L may occur in two separate steps. For example, the second handle substrate 20L may be removed first (via a planarization process or etching), followed by the removal of the second insulator layer 22L (via a planarization process or etching).

Figure 6:
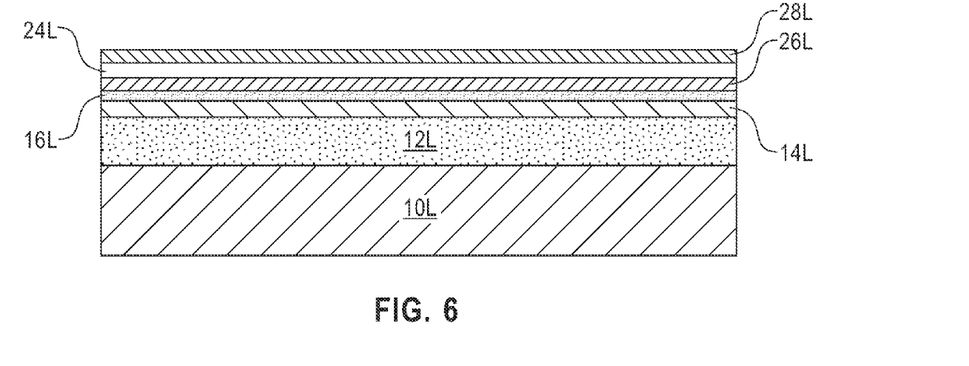
FIG. 6 is a cross sectional view of the exemplary semiconductor structure of FIG. 5 after forming a third dielectric layer on an exposed surface of the second semiconductor material layer.

Referring now to FIG. 6, there is illustrated the exemplary semiconductor structure of FIG. 5 after forming a third dielectric layer 28L on an exposed surface of the second semiconductor material layer 24L that is now attached to the first substrate (10L, 12L, 14L) through bonded dielectric layers 16L, 26L.

The third dielectric layer 28L may include one of the materials mentioned above for the first dielectric layer 16L. In one embodiment, the third dielectric layer 28L may comprise a same material as the first and second dielectric layers 16L, 26L. For example, the first, second and third dielectric layers (16L, 26L, 28L) may all be composed of silicon dioxide. In another embodiment, the third dielectric layer 28L may comprise a same material as the first dielectric layer 16L, but a different material than the second dielectric layer 26L. In yet another embodiment, the third dielectric layer 28L may comprise a same material as the second dielectric layer 26L, but a different material than the first dielectric layer 16L.

The third dielectric layer 28L may have a thickness within the range mentioned above for the first dielectric layer 16L. The thickness of the third dielectric layer 28L may be the same as, lesser than, or greater than, the thickness of the first and/or second dielectric layers (16L, 26L). The third dielectric layer 28L may be formed utilizing one of the techniques mentioned above in forming the first dielectric layer 16L.

In some embodiments, third dielectric layer 28L is used to provide bonding to a third substrate. In yet other embodiments, the third dielectric layer 28L may be used as topmost hard mask layer during a subsequent patterning process.

Figure 7:
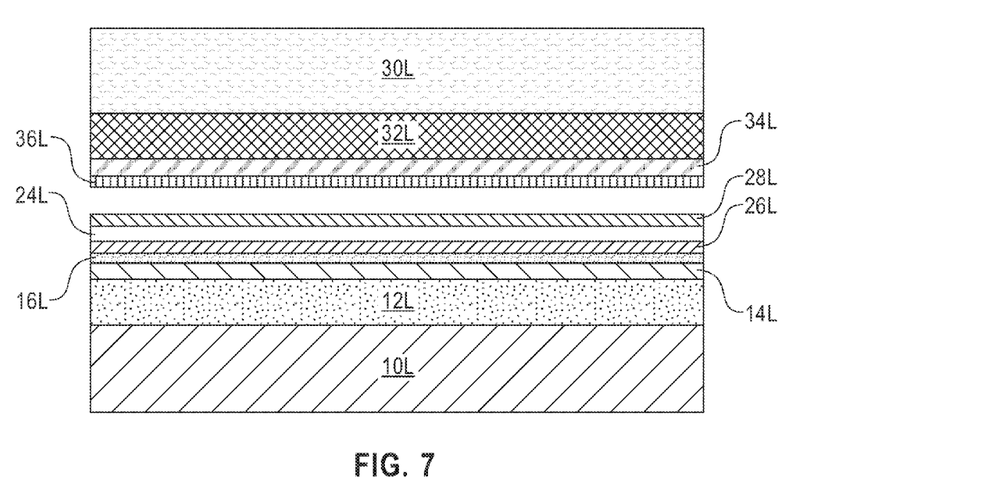
FIG. 7 is a cross sectional view showing an optional third substrate atop the exemplary semiconductor structure of FIG. 6 and including a third handle substrate, a third insulator layer, and a third semiconductor material layer, wherein a fourth dielectric layer is located on the third semiconductor material layer.

Referring now to FIG. 7, there is illustrated an optional third substrate (30L, 32L, 34L) atop the exemplary semiconductor structure of FIG. 6. The third substrate includes a third handle substrate 30L, a third insulator layer 32L, and a third semiconductor material layer 34L. A fourth dielectric layer 36L is located on the third semiconductor material layer 34L.

The third handle substrate 30L may include any of the materials mentioned above for the first handle substrate 10L. In one embodiment, the first handle substrate 10L and the third handle substrate 30L include a same material. In one example, the first handle substrate 10L and the third handle substrate 30L include silicon.

The third insulator layer 32L may include any of the materials mentioned above for the first insulator layer 12L. In one embodiment, the first insulator layer 12L and the third insulator layer 32L may include a same insulator material such as, for example, silicon dioxide.

The third semiconductor material layer 34L may include one of the semiconductor materials mentioned above for the first semiconductor material layer 14L. In one embodiment, the third semiconductor material layer 34L, the second semiconductor material layer 24L and the first semiconductor material layer 14L comprise a same semiconductor material, such as, for example, silicon or a silicon germanium alloy. In another embodiment, the third semiconductor material layer 34L comprises a different semiconductor material than one of the first semiconductor material layer 14L and the second semiconductor material layer 24L. In yet another embodiment, the third semiconductor material layer 34L comprises a different semiconductor material than the first and second semiconductor material layers (14L, 24L), and the first semiconductor material layer 14L comprises a different semiconductor material than the second semiconductor material 24L. Stated in different terms, the first semiconductor material layer 14L, and the second semiconductor material layer 24L and the third semiconductor material layer 34L may comprise different semiconductor materials altogether. The third semiconductor material layer 34L that is provided has a same thickness as that of the first and second semiconductor material layers 14L, 24L mentioned above.

The third substrate (30L, 32L, 34L) may be referred to as a third SOI substrate. The third substrate (30L, 32L, 34L) can be formed utilizing one of the techniques mentioned above in forming the first substrate (10L, 12L, 14L).

The fourth dielectric layer 36L may include one of the materials mentioned above for the first dielectric layer 16L. In one embodiment of the present application, the first, second, third and fourth dielectric layers 16L, 26L, 28L, 36L are all composed of a same material such as, for example, silicon dioxide. The fourth dielectric layer 36L may have a thickness within the range mentioned above for the first dielectric layer 16L. The thickness of the fourth dielectric layer 36L may be the same as, lesser than, or greater than, the thickness of the first dielectric layer 16L, the second dielectric layer 26L and the third dielectric layer 28L. The fourth dielectric layer 36L may be formed utilizing one of the techniques mentioned above in forming the first dielectric layer 16L.

Figure 8:
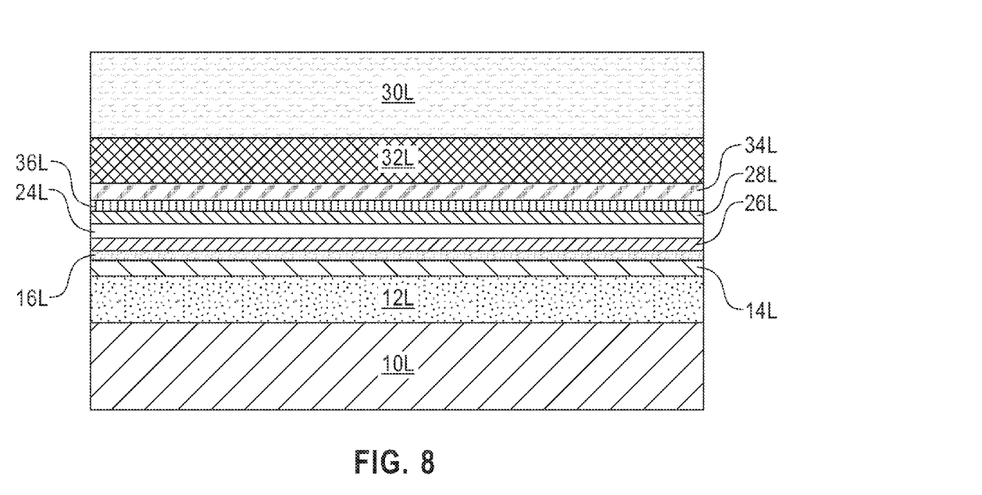
FIG. 8 is a cross sectional view of the exemplary semiconductor structure of FIG. 7 after bonding the third dielectric layer to the fourth dielectric layer.

Referring now to FIG. 8, there is illustrated the exemplary semiconductor structure of FIG. 7 after bonding the third dielectric layer 28L to the fourth dielectric layer 36L. The bonding can be performed as described above. The bonding forms a dielectric-to-dielectric interface between the third dielectric layer 28L and the fourth dielectric layer 36L.

Figure 9:
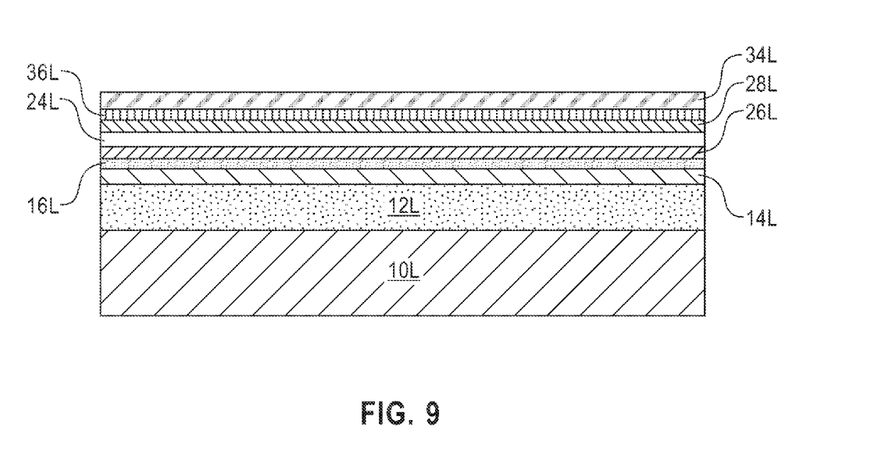
FIG. 9 is a cross sectional view of the exemplary semiconductor structure of FIG. 8 after removing the third handle substrate and the third insulator layer.

Referring now to FIG. 9, there is illustrated the exemplary semiconductor structure of FIG. 8 after removing the third handle substrate 30L and the third insulator layer 32L from the bonded structure of FIG. 8. The third handle substrate 30L and the third insulator layer 32L can be removed utilizing one of the techniques mentioned above in removing the second handle substrate 20L and the second insulator layer 22L from the bonded structure shown in FIG. 4.

Although not shown, additional SOI substrates and dielectric layers can be provided and bonded to each other in the manner described above and illustrated in FIGS. 1-5. The number of additional SOI substrates and dielectric layers is not limited and can be selected to provide a desired numbered of semiconductor nanowires within a given stack of semiconductor nanowires.

Figure 10:
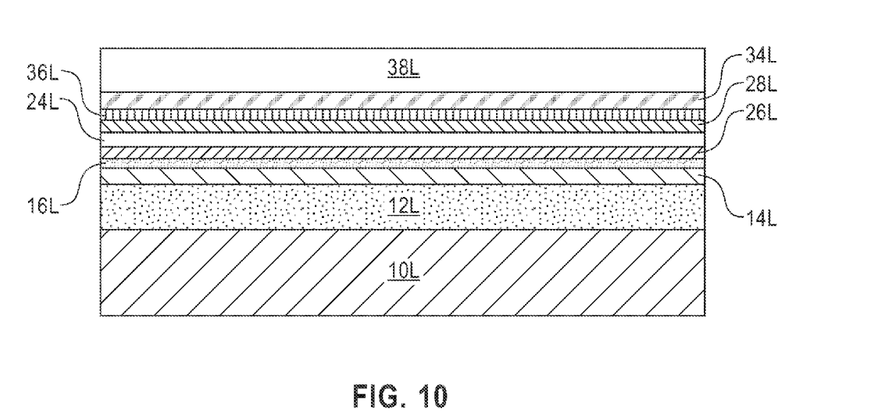
FIG. 10 is a cross sectional view of the exemplary semiconductor structure of FIG. 9 after forming a hard mask material layer on an exposed surface of the third semiconductor material layer.

Referring now to FIG. 10, there is illustrated the exemplary semiconductor structure of FIG. 9 after forming a hard mask material layer 38L on an exposed surface of the third semiconductor material layer 34L. The hard mask material layer 38L may include any hard mask material such as, for example, a dielectric oxide, dielectric nitride and/or a dielectric oxynitride. In one example, the hard mask material layer 38L is composed of a dielectric oxide such as, for example, silicon dioxide. The hard mask material layer 38L may be formed utilizing one of the techniques mentioned above in forming the first dielectric layer 16L. The hard mask material layer 38L may have a thickness from 5 nm to 25 nm, although other thicknesses that are lesser than, or greater than, the aforementioned thickness range may also be used in the present application. In some embodiments, the thickness of the hard mask material layer 38L may be the same as the combined thickness of the first and second dielectric layers (16L, 26L) and/or the combined thickness of the third and fourth dielectric layers (28L, 36L).

Figure 11:
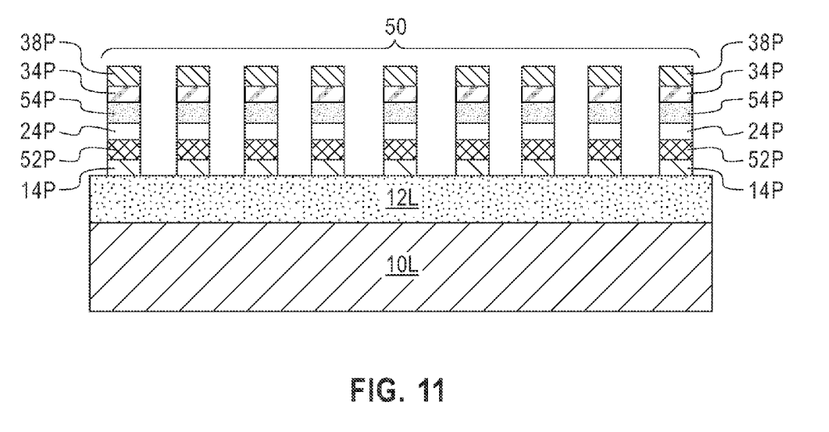
FIG. 11 is a cross sectional view of the exemplary semiconductor structure of FIG. 10 after patterning the hard mask material layer, the third semiconductor material layer, the fourth dielectric layer, the third dielectric layer, the second semiconductor material layer, the second dielectric layer, the first dielectric layer and the first semiconductor material layer to provide a plurality of fin stack structures extending upwards from different portions of the first insulator layer, wherein each fin stack structure includes, from bottom to top, a first semiconductor material fin portion, a combined first and second dielectric fin portion, a second semiconductor fin portion, a combined third and fourth dielectric fin portion, a third semiconductor fin portion and a hard mask fin portion.

Referring now to FIG. 11, there is illustrated the exemplary semiconductor structure of FIG. 10 after patterning the hard mask material layer 38L, the third semiconductor material layer 34L, the fourth dielectric layer 36L, the third dielectric layer 28L, the second semiconductor material layer 24L, the second dielectric layer 26L, the first dielectric layer 16L and the first semiconductor material layer 14L to provide a plurality of fin stack structures 50 extending upwards from different portions of the first insulator layer 12L. Although the present application describes and illustrates a plurality of fin stack structures being formed, the present application can also be used to provide a single fin stack structure.

Each fin stack structure 50 includes, from bottom to top, a first semiconductor material fin portion 14P, a combined first and second dielectric fin portion 52P, a second semiconductor fin portion 24P, a combined third and fourth dielectric fin portion 54P, a third semiconductor fin portion 34P and a hard mask fin portion 38P. The combined first and second dielectric fin portion 52P may be referred to as a first dielectric fin portion, and the combined the combined third and fourth dielectric fin portion may be referred to a second dielectric fin portion.

Each combined first and second dielectric fin portion 52P comprises a remaining portion of the first dielectric layer 16L and a remaining portion of the second dielectric layer 26L (in the drawings a single layered structure is shown for clarity and can be used to illustrated an embodiment in which the first and second dielectric layers (16L, 26L) are composed of the same material). Each combined third and fourth dielectric fin portion 54P comprises a remaining portion of the third dielectric layer 28L and a remaining portion of the fourth dielectric layer 36L (in the drawings a single layered structure is shown for clarity and assumes one embodiment in which the third and fourth dielectric layers 28L, 36L are composed of the same material).

In one embodiment of the present application, the patterning used to provide the plurality of fin stack structures 50 may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In the illustrated embodiment, the etch stops on the topmost surface of the first insulator layer 12L.

In another embodiment of the present application, the patterning used to provide the fin stack structures 50 may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. The etch stops on a topmost surface of the first insulator layer 12L. Upon completion of the pattern transfer, the SIT process concludes by removing the spacers from the structure. Each spacer may be removed by etching or a planarization process.

As used herein, a "fin stack structure" refers to a material stack of from bottom to top, a first semiconductor material fin portion 14P, a combined first and second dielectric fin portion 52P, a second semiconductor fin portion 24P, an optional combined third and fourth dielectric fin portion 54P, an optional third semiconductor fin portion 34P, and a hard mask fin portion 38P, and including a pair of vertical sidewalls that are parallel to each other. As used herein, a surface is "vertical" if there exists a vertical plane from which the surface does not deviate by more than three times the root mean square roughness of the surface. In one embodiment of the present application, each fin stack structure has a width from 5 nm to 30 nm. Other widths that is lesser than, or greater than the range mentioned herein can also be used in the present application. Each fin stack structure 50 is spaced apart from its nearest neighboring fin stack structure 50 by a pitch of from 20 nm to 100 nm. Also, each fin stack structure 50 is oriented parallel to each other.

As is shown, each semiconductor material fin portion of the fin stack structure is located between an underlying layer of an insulator (i.e., dielectric) layer and an overlying layer of an insulator (i.e., dielectric) layer. As is further shown, each fin portion within the fin stack structure 50 has sidewall surfaces that are vertically aligned with each. As such, the width of each fin portion of the fin stack structure is the same.

Figure 12:
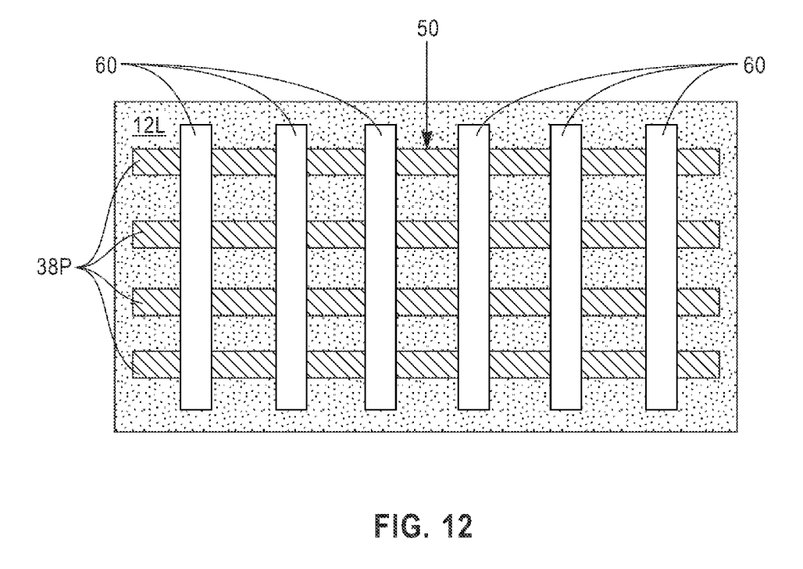
FIG. 12 is a top down view of the exemplary semiconductor structure of FIG. 11 after forming at least one sacrificial gate structure straddling over a portion of each fin stack structure.

Referring now to FIG. 12, there is illustrated the exemplary semiconductor structure of FIG. 11 after forming at least one sacrificial gate structure 60 straddling over a portion of each fin stack structure 50. By "sacrificial gate structure" it is meant a material or material stack that serves as a placeholder for a subsequently formed functional gate structure. By "straddling over" it is meant that one material is formed atop and along sidewall surfaces of another material. Although a plurality of sacrificial gate structures 60 is described and illustrated, the present application can also be used when a single sacrificial gate structure is formed.

Each sacrificial gate structure 60 may include a sacrificial gate dielectric portion, a sacrificial gate material portion and a sacrificial gate cap portion. In some embodiments, each sacrificial gate dielectric portion and/or each sacrificial gate cap portion may be omitted. For clarity, each sacrificial gate structure 60 is shown a single piece.

When present, the sacrificial gate dielectric portion includes a dielectric material such as for example, a dielectric oxide, dielectric nitride and/or a dielectric oxynitride. In one example, the sacrificial gate dielectric portion may be composed of silicon dioxide and/or silicon nitride. The gate dielectric that may provide the sacrificial gate dielectric portion may be formed utilizing a deposition process such as, for example, chemical vapor deposition or plasma enhanced chemical vapor deposition. The thickness of the sacrificial gate dielectric can be from 5 nm to 10 nm; although other thickness that are lesser than, or greater than, the aforementioned range may be used. The sacrificial gate conductor portion may include polysilicon or a metal or metal alloy. The material that provides the sacrificial gate conductor portion can be formed utilizing a deposition process such as, for example, chemical vapor deposition, plasma enhanced chemical vapor deposition, or sputtering. The sacrificial gate conductor portion may have a thickness from 25 nm to 150 nm, although other thickness that are lesser than, or greater than, the aforementioned thickness range can also be employed. If present, the sacrificial gate cap portion may include one of the hard mask materials mentioned above in providing the hard mask material layer 38L. The hard mask material that provides the sacrificial gate cap portion can be formed by a deposition process such chemical vapor deposition or plasma enhanced chemical vapor deposition. The sacrificial gate cap portion can have a thickness from 5 nm to 20 nm, although other thicknesses that are lesser than, or greater than, the aforementioned thickness range may also be employed. Each sacrificial gate structure 60 can be formed by deposition of the various material layers and then patterning the resultant sacrificial dielectric material sack by utilizing, for example, lithography and etching.

Figure 13A:
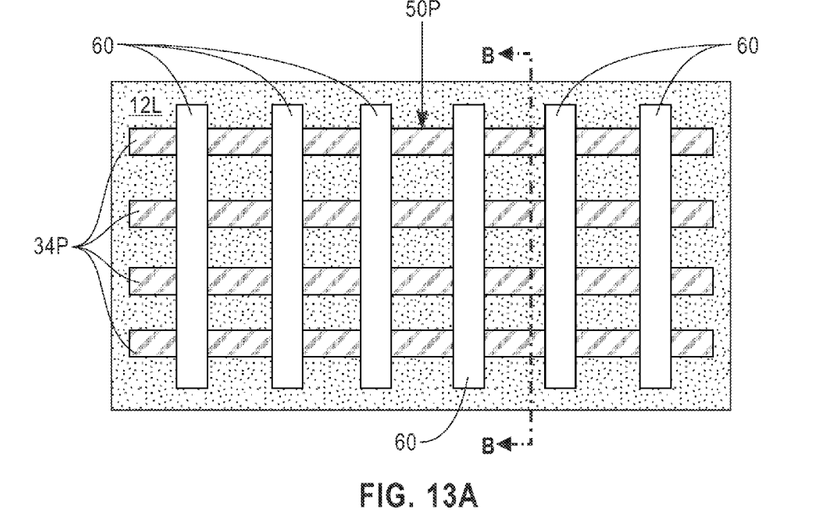
FIG. 13A is a top down view of the exemplary semiconductor structure of FIG. 12 after removing the hard mask fin portion, the combined third and fourth dielectric fin portion, and the combined first and second dielectric fin portion that are not protected by the sacrificial gate structure.
Figure 13B:
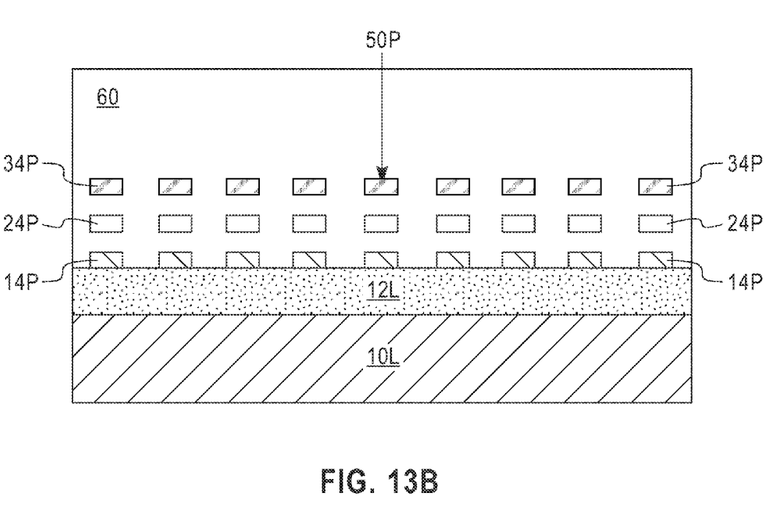
FIG. 13B is a cross sectional view of the exemplary semiconductor structure of FIG. 13A along vertical plane B-B'.

Referring now to FIGS. 13A-13B, there are illustrated various views the exemplary semiconductor structure of FIG. 12 after removing the hard mask fin portion 38P, the combined third and fourth dielectric fin portion 54P, and the combined first and second dielectric fin portion 52P that are not protected by the sacrificial gate structure 60. In the drawings, element 50P denotes a fin stack structure in which portions of the hard mask fin portion 38P, the combined third and fourth dielectric fin portion 54P, and the combined first and second dielectric fin portion 52P that are not protected by the sacrificial gate structure 60 and within the source region and the drain region have been removed therefrom.

In accordance with the present application, each sacrificial gate structure 60 is used as an anchoring structure during the removal of the hard mask fin portion 38P, the combined third and fourth dielectric fin portion 54P, and the combined first and second dielectric fin portion 52P that are not protected by the sacrificial gate structure 60. Also, and in accordance with the present application, the removing the hard mask fin portion 38P, the combined third and fourth dielectric fin portion 54P, and the combined first and second dielectric fin portion 52P that are not protected by the sacrificial gate structure 60 releases portions of each first semiconductor material fin portion 14P, the second semiconductor fin portion 24P, and the third semiconductor fin portion 34P in the source region and drain region of the structure. Although not shown in the drawings, portions of each of the hard mask fin portion 38P, the combined third and fourth dielectric fin portion 54P, and the combined first and second dielectric fin portion 52P remain beneath each sacrificial gate structure 60. In FIG. 13B, one of the sacrificial gate structures 60 is shown and that sacrificial gate structure is located behind the released first semiconductor material fin portion 14P, the second semiconductor fin portion 24P, the third semiconductor fin portion 34P.

The removing the hard mask fin portion 38P, the combined third and fourth dielectric fin portion 54P, and the combined first and second dielectric fin portion 52P that are not protected by the sacrificial gate structure 60 can be performed utilizing an etching process this is selective in removing the material that provides each of the hard mask fin portion 38P, the combined third and fourth dielectric fin portion 54P, and the combined first and second dielectric fin portion 52P that are not protected by a sacrificial gate structure 60. In one example, aqueous hydrofluoric acid or a dry etch like chemical oxide removal (COR) can be used in removing the hard mask fin portion 38P, the combined third and fourth dielectric fin portion 54P, and the combined first and second dielectric fin portion 52P that are not protected by the sacrificial gate structures 60.

Figure 14:
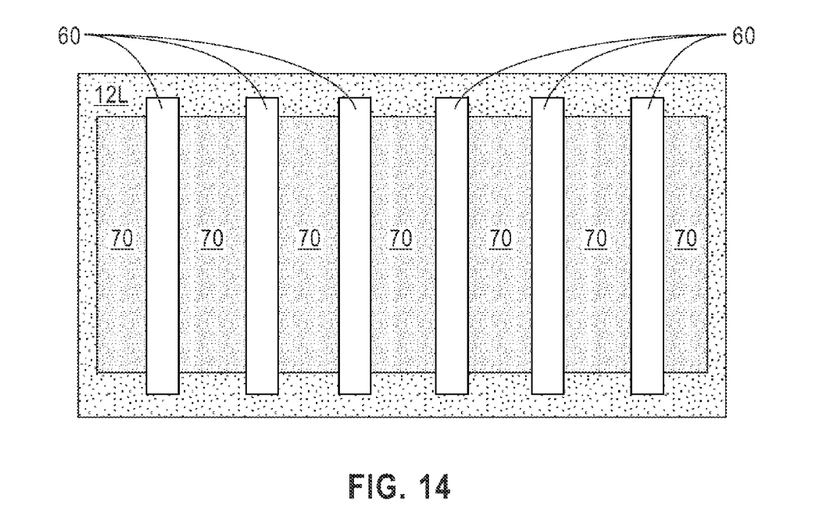
FIG. 14 is a top down view of the exemplary semiconductor structure of FIGS. 13A-13B after forming an epitaxial semiconductor material structure from exposed semiconductor material surfaces of each fin stack structure that are located on either side of each sacrificial gate structure.

Referring now to FIG. 14, there is illustrated the exemplary semiconductor structure of FIGS. 13A-13B after forming an epitaxial semiconductor material structure 70 from exposed semiconductor material surfaces (i.e., the released first semiconductor material fin portion 14P, the second semiconductor fin portion 24P, and the third semiconductor fin portion 34P) of each fin stack structure that are located on either side of each sacrificial gate structure 60.

The epitaxial semiconductor material structure 70 may be formed utilizing a selective epitaxial growth (or deposition) process. The term "selective" when used in conjugation with the phrase "selective epitaxial growth" denotes that the epitaxial material is grown only on semiconductor material surfaces not insulator or conductor surfaces. Thus, in the present application, each epitaxial semiconductor material structure 70 is formed from exposed surfaces of the released first semiconductor material fin portion 14P, the second semiconductor fin portion 24P, and the third semiconductor fin portion 34P that are not covered by the sacrificial gate structure 60. Each epitaxial semiconductor material structure 70 completely surrounds the released second semiconductor fin portion 24P and the third semiconductor fin portion 34P of each fin stack structure. Each epitaxial semiconductor material structure 70 is located around the sidewall surfaces and topmost surface of the released first semiconductor fin portion 14P of each fin stack structure.

Each epitaxial semiconductor material structure 70 comprises an epitaxial semiconductor material that is doped. The epitaxial semiconductor material that provides each epitaxial semiconductor material structure 70 may include one of the semiconductor materials mentioned above for the handle substrate 10L. In one example, silicon or a silicon germanium alloy may be used as the epitaxial semiconductor material. In one embodiment, the epitaxial semiconductor material comprises a same semiconductor material as at least one of the first semiconductor material fin portion 14P, the second semiconductor fin portion 24P, and the third semiconductor fin portion 34P. In another embodiment, the epitaxial semiconductor material comprises a different semiconductor material than each of the first semiconductor material fin portion 14P, the second semiconductor fin portion 24P, and the third semiconductor fin portion 34P.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a 11001 crystal surface will take on a 11001 orientation. In the present application, the epitaxial semiconductor material structure 70 has an epitaxial relationship with exposed surfaces of each of the released first semiconductor material fin portions 14P, the second semiconductor fin portions 24P, and the third semiconductor fin portions 34P.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of each epitaxial semiconductor material structure 70 can be performed utilizing any well known precursor gas or gas mixture including for example, a silicon containing precursor gas (such as silane) and/or a germanium containing precursor gas (such as a germane). Carrier gases like hydrogen, nitrogen, helium and argon can be used.

The dopant that can be present in each epitaxial semiconductor material structure 70 may be n-type dopant or p-type dopant. The dopant is typically introduced into the precursor gas during the epitaxial growth process. In other embodiments, the dopant can be introduced after the epitaxial growth process. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. Each epitaxial semiconductor material structure 70 has a dopant concentration that can be within a range from $2\times10^{20}$ atoms/cm$^3$ to $1\times10^{21}$ atoms/cm$^3$.

Figure 15:
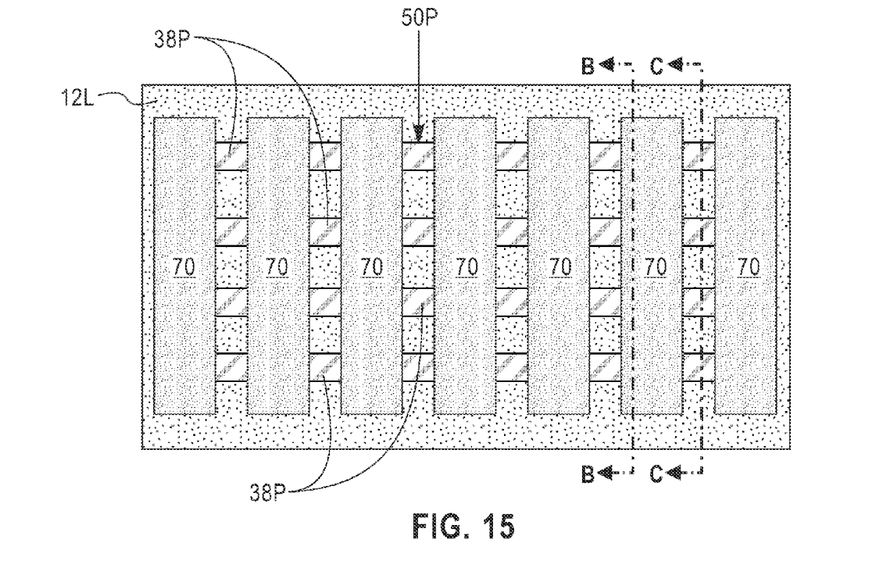
FIG. 15 is a top down view of the exemplary semiconductor structure of FIG. 14 after removing the at least one sacrificial gate structure.

Referring now to FIG. 15, there is illustrated the exemplary semiconductor structure of FIG. 14 after removing the at least one sacrificial gate structure 60. As is shown, the hard mask fin portion 38P of each fin stack structure that was previously located beneath each sacrificial gate structure 60 is now exposed. The removal of each sacrificial gate structure 60 can be performed utilizing an etching process that is selective in removing the material or material stack that provides the sacrificial gate structure 60. In one example, and when polysilicon is used as the sacrificial gate structures 60, hot ammonia can be used to remove polysilicon.

Figure 16A:
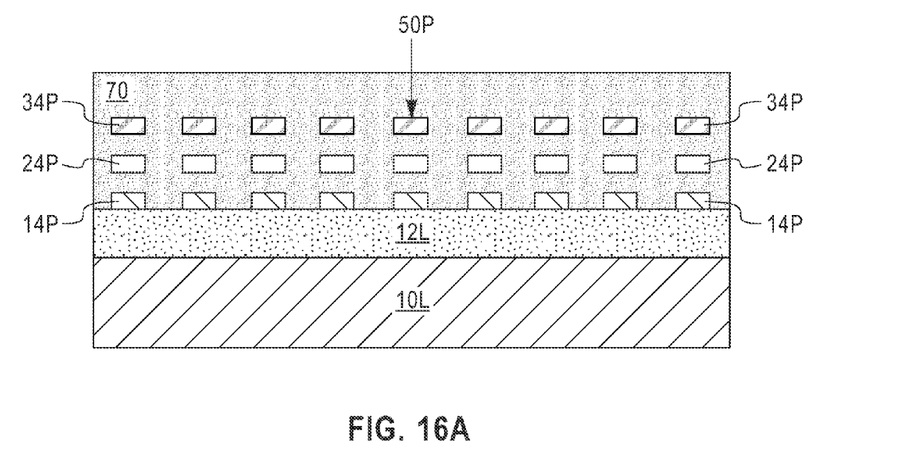
FIG. 16A is a cross sectional view of the exemplary semiconductor structure of FIG. 15 through vertical plane B-B' after suspending the third semiconductor material fin portion and the second semiconductor fin portion that were located previously beneath the sacrificial gate structure.
Figure 16B:
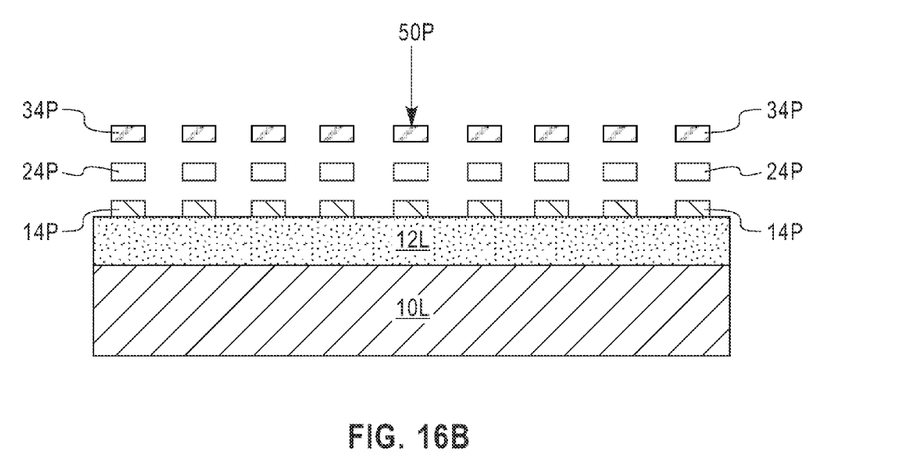
FIG. 16B is a cross sectional view of the exemplary semiconductor structure of FIG. 15 through vertical plane C-C' after suspending the third semiconductor material fin portion and the second semiconductor fin portion of each fin stack structure that were located previously beneath the sacrificial gate structure.

Referring now to FIGS. 16A-16B, there are illustrated the exemplary semiconductor structure of FIG. 15 after suspending the third semiconductor material fin portion 34P and the second semiconductor fin portion 24P that were located previously beneath the sacrificial gate structure 60. In this step of the present application, the remaining hard mask fin portions 38P, the combined third and fourth dielectric fin portion 54P, and the combined first and second dielectric fin portion 52P are completely removed from the structure. The suspending the third semiconductor material fin portion 34P and the second semiconductor fin portion 24P that were located previously beneath the sacrificial gate structure 60 includes the selective etch that was mentioned above in providing the exemplary semiconductor structure shown in FIGS. 13A-13B of the present application.

Figure 17A:
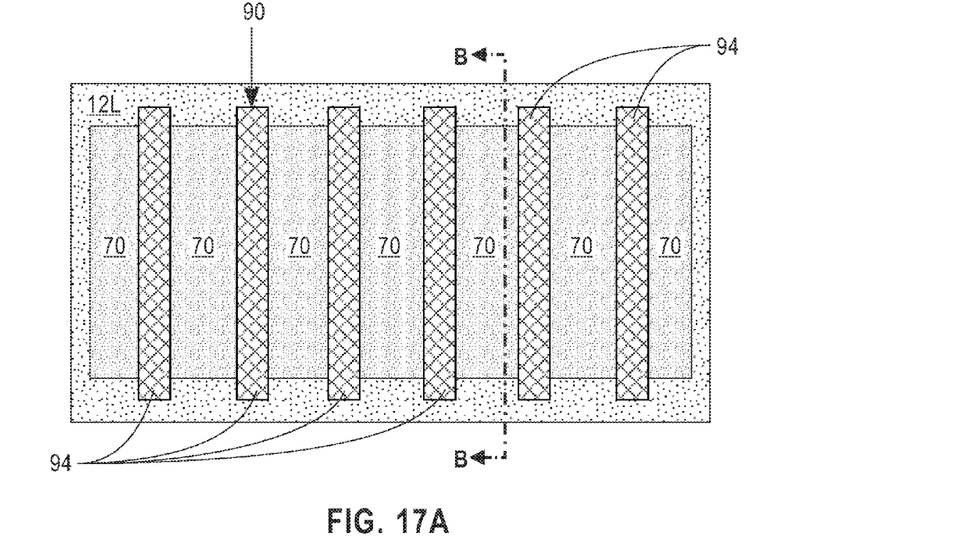
FIG. 17A is top down view of the exemplary semiconductor structure of FIGS. 16A-16B after recessing the first insulator layer to suspend the first semiconductor fin portion of each fin stack structure and forming a functional gate structure wrapping around each suspended first semiconductor fin portion, each second semiconductor fin portion and each third semiconductor fin portion.
Figure 17B:
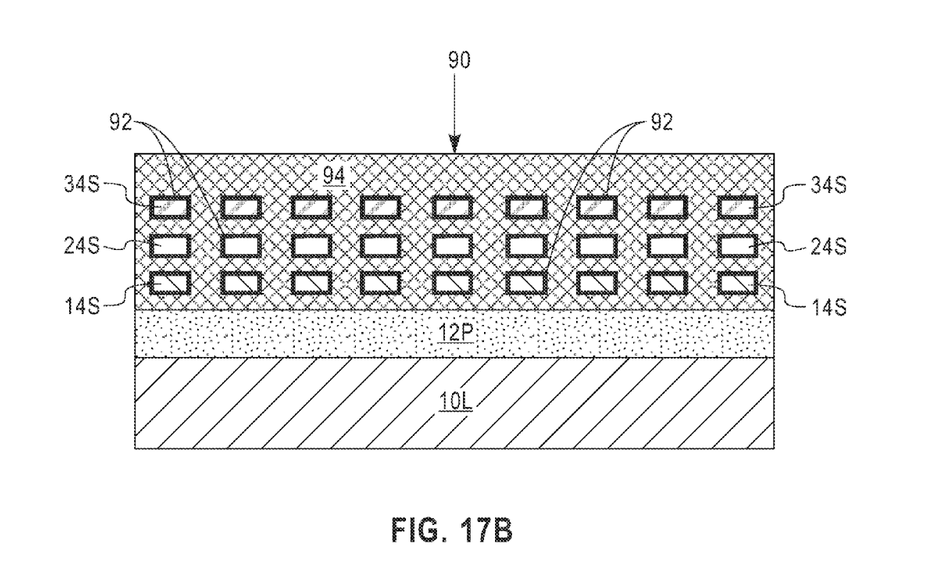
FIG. 17B is a cross sectional view of the exemplary semiconductor structure of FIG. 17A along vertical plane B-B'.

Referring now to FIGS. 17A-17B, there are illustrated the exemplary semiconductor structure of FIGS. 16A-16B after recessing the first insulator layer 12L to suspend the first semiconductor fin portion 14P of each fin stack structure and forming a functional gate 90 structure wrapping around each suspended first semiconductor fin portion, each suspended second semiconductor fin portion and each suspended third semiconductor fin portion.

The remaining portion of the first insulator layer 12L that is formed can be referred to herein as a first insulator portion 12P and can have a thickness that is less than the original thickness of the first insulator layer 12L. Each suspended first semiconductor fin portion can be referred to herein as a first suspended semiconductor nanowire 14S, each suspended second semiconductor fin portion can be referred to herein as a second suspended semiconductor nanowire 24S, and each suspended third semiconductor fin portion can be referred to herein as a third suspended semiconductor nanowire 34S. In accordance with the present application, each suspended first semiconductor nanowire 14S, each suspended second semiconductor nanowire 24S, and each suspended third semiconductor nanowire 34S have a same shape and dimension.

The recessing of the first insulator layer 12L which provides first insulator portion 12P can be performed utilizing an etching process that is selective in removing the insulator material that provides the first insulator layer 12L. In one example, and when the first insulator layer 12L comprises silicon dioxide, aqueous hydrofluoric acid can be used to recess the first insulator layer 12L.

The functional gate 90 includes a gate dielectric portion 92 and a gate conductor portion 94. The functional gate structure 90 can be formed by first providing a gate dielectric material and a gate conductor material. A gate patterning process may follow the deposition of the gate dielectric material and the gate conductor material. By "functional gate structure" it is meant a permanent gate structure used to control output current (i.e., flow of carriers in the channel) of a semiconducting device through electrical or magnetic fields. As is shown, the gate conductor portion 92 is present entirely around each semiconductor nanowire 14S, 24S and 34S.

The gate dielectric portion 92 may include a gate dielectric material. The gate dielectric material that provides the gate dielectric portion 92 can be an oxide, nitride, and/or oxynitride. In one example, the gate dielectric material that provides the gate dielectric portion 92 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 92. In some embodiments, a first set of functional gate structures includes a first gate dielectric portion, while a second set of functional gate structures comprises a second gate dielectric portion. In such an embodiment, the first gate dielectric material portion may be the same as, or different from, the second gate dielectric material portion.

The gate dielectric material used in providing the gate dielectric portion 92 can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions of different functional gate structures, block mask technology can be used. In one embodiment of the present application, the gate dielectric material used in providing the gate dielectric portion 92 can have a thickness in a range from 1 nm to 10 nm. Other thicknesses that are lesser than, or greater than, the aforementioned thickness range can also be employed for the gate dielectric material that may provide the gate dielectric portion 92.

The gate conductor portion 94 can include a gate conductor material. The gate conductor material used in providing the gate conductor portion 94 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, a first set of functional gate structures includes a first gate conductor portion, while a second set of functional gate structures comprises a second gate conductor portion. In such an embodiment, the first gate conductor portion may be the same as, or different from, the second gate conductor portion. For example, the first gate conductor portion may comprise an nFET gate metal, while the second gate conductor portion may comprise a pFET gate metal. In another example, the first gate conductor portion may comprise a pFET gate metal, while the second gate conductor portion may comprise an nFET gate metal.

The gate conductor material used in providing the gate conductor portion 94 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of different functional gate structures, block mask technology can be used. In one embodiment, the gate conductor material used in providing the gate conductor portion 94 has a thickness from 50 nm to 200 nm. Other thicknesses that are lesser than, or greater than, the aforementioned thickness range can also be employed for the gate conductor material used in providing the gate conductor portion 94.

The method of the present application as described in detail herein above can provide stacked semiconductor nanowires that have a uniform shape and dimension (i.e., height and width). Each stacked semiconductor nanowire can be non-rounded as is shown in the drawings of the present application. The method of the present application can also allow stacking of any semiconductor material independent of its lattice constant. The method of the present application can further allow any number of stacked semiconductor nanowires to be formed in which any type of semiconductor material can be selected from each stacked semiconductor nanowire. In some embodiments, it is possible to provide different semiconductor materials for each stacked semiconductor nanowire. The method of the present application also provides stacked and suspended nanowires utilizing etching processes that remove the dielectric (i.e., insulator) material that is located above and below each semiconductor fin portion that is used to provide each stacked and suspended semiconductor nanowire.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
    providing at least one fin stack structure on an insulator layer, said at least one fin stack structure comprising, from bottom to top, a first semiconductor fin portion, a dielectric fin portion, a second semiconductor fin portion and a hard mask fin portion;
    forming at least one sacrificial gate structure on a portion of said at least one fin stack structure;
    removing said hard mask fin portion and said dielectric fin portion that are not located beneath said at least one sacrificial gate structure;
    forming an epitaxial semiconductor material structure from exposed surfaces of said first semiconductor fin portion and said second semiconductor fin portion not covered by said at least one sacrificial gate structure;
    removing said at least one sacrificial gate structure;
    removing remaining portions of said hard mask fin portion and remaining portions of said dielectric fin portion that were previously located beneath said at least one sacrificial gate structure; and
    recessing said insulating layer, wherein after said recessing said insulator layer, said first semiconductor fin portion and said second semiconductor fin portion are suspended and are stacked one atop the other.

2. The method of claim 1, further comprising forming a functional gate structure wrapping around said first semiconductor fin portion and said second semiconductor fin portion.

3. The method of claim 1, wherein said at least one fin stack structure includes at least one more additional material stack of, from bottom to top, an additional dielectric fin portion and an additional semiconductor fin portion located between said second semiconductor fin portion and said hard mask fin portion.

4. The method of claim 1, wherein said providing said at least one fin stack structure on said insulator layer comprises:
    providing, in any order, a first substrate comprising, from bottom to top, a handle substrate, a first insulator layer, a first semiconductor material layer, and a first dielectric layer, and a second substrate comprising, from bottom to top, a second handle substrate, a second insulator layer, a second semiconductor material layer and a second dielectric layer;
    bonding said second dielectric layer of said second substrate to said first dielectric layer of said first substrate;
    removing, after said bonding, said second handle substrate and said second insulator layer;
    forming a hard mask material layer on an exposed surface of said second semiconductor material layer; and
    patterning said hard mask material layer, said second semiconductor material layer, said second dielectric layer, said first dielectric layer and said first semiconductor material layer to provide said at least one fin stack structure, wherein a remaining portion of said first and second dielectric layers provide said dielectric fin portion.

5. The method of claim 4, wherein said patterning comprises a sidewall image transfer process.

6. The method of claim 1, wherein said removing said hard mask fin portion and said dielectric fin portion that are not located beneath said at least one sacrificial gate comprises an etching process.

7. The method of claim 1, wherein said forming said epitaxial semiconductor material structure comprises a selective epitaxial growth process.

8. The method of claim 1, wherein said removing remaining portions of said hard mask fin portion and remaining portions of said dielectric fin portion that were previously located beneath said at least one sacrificial gate structure comprises an etching process.

9. The method of claim 1, wherein said first and second semiconductor fin portions comprise a same semiconductor material, and said first and second semiconductor fin portions have a same shape and dimension.

10. The method of claim 1, wherein said first and second semiconductor fin portions comprise different semiconductor materials, and said first and second semiconductor fin portions have a same shape and dimension.

11. The method of claim 2, wherein said functional gate structure comprises a gate dielectric portion and a gate conductor portion, wherein said gate dielectric portion is present entirely around said first semiconductor fin portion and said second semiconductor fin portion that are suspended and are stacked one atop the other.

12. The method of claim 11, wherein after recessing said insulator layer and said forming said functional gate structure, a remaining portion of said insulator layer has a topmost surface contacting a portion of said gate conductor portion of said functional gate structure and a bottommost surface contacting a topmost surface of a handle substrate.

13. The method of claim 1, wherein during said removing said hard mask fin portion and said dielectric fin portion that are not located beneath said at least one sacrificial gate structure, said at least ones sacrificial gate structure serves as an anchoring structure.

14. The method of claim 13, wherein during said removing remaining portions of said hard mask fin portion and remaining portions of said dielectric fin portion that were previously located beneath said at least one sacrificial gate structure, said epitaxial semiconductor material structure severs as an anchoring structure.

15. The method of claim 1, wherein said recessing said insulator layer comprises a selective etching process.

* * * * *